(12) United States Patent
Dupuy et al.

(10) Patent No.: US 10,892,221 B2
(45) Date of Patent: Jan. 12, 2021

(54) TRANSFORMER FOR A CIRCUIT IN MMIC TECHNOLOGY

(71) Applicants: Thales, Courbevoie (FR); Université de Bordeaux, Bordeaux (FR); Institut Polytechnique de Bordeaux, Talence (FR); Centre National de la Recherche Scientifique, Paris (FR)

(72) Inventors: Victor Dupuy, Elancourt (FR); Benoît Mallet-Guy, Elancourt (FR); Yves Mancuso, Elancourt (FR); Eric Kerherve, Pessac (FR)

(73) Assignees: THALES, Courbevoie (FR); UNIVERSITÉ DE BORDEAUX, Bordeaux (FR); INSTITUT POLYTECHNIQUE DE BORDEAUX, Talence (FR); CENTRE NATIONAL DE LA RECHERCHE SCIENTIFIQUE, Paris (FR)

( * ) Notice: Subject to any disclaimer, the term of this patent is extended or adjusted under 35 U.S.C. 154(b) by 163 days.

(21) Appl. No.: 15/739,721

(22) PCT Filed: Jun. 24, 2016

(86) PCT No.: PCT/EP2016/064745
§ 371 (c)(1),
(2) Date: Dec. 23, 2017

(87) PCT Pub. No.: WO2016/207396
PCT Pub. Date: Dec. 29, 2016

(65) Prior Publication Data
US 2018/0197816 A1 Jul. 12, 2018

(30) Foreign Application Priority Data

Jun. 25, 2015 (FR) ...................... 15 01335

(51) Int. Cl.
H01L 23/52 (2006.01)
H01F 17/00 (2006.01)
(Continued)

(52) U.S. Cl.
CPC ..... *H01L 23/5227* (2013.01); *H01F 17/0006* (2013.01); *H01F 17/0013* (2013.01);
(Continued)

(58) Field of Classification Search
CPC ......... H01L 2223/6672; H01L 23/5227; H01F 17/0006
See application file for complete search history.

(56) References Cited

U.S. PATENT DOCUMENTS 5,095,357 A * 3/1992 Andoh ................ H01F 17/0006
257/379
6,060,976 A * 5/2000 Yamaguchi ......... H01F 27/2804
336/200

(Continued)

OTHER PUBLICATIONS

PCT/EP20161064745, International Search Report, dated Sep. 9, 2016, 4 pages.

*Primary Examiner* — Elvin G Enad
*Assistant Examiner* — Malcolm Barnes
(74) *Attorney, Agent, or Firm* — Soquel Group LLC

(57) ABSTRACT

This transformer includes primary and secondary tracks (10, 20) that are coupled to one another by mutual inductance, the primary and secondary tracks being superimposed on top of each other in two parallel planes while being arranged to follow the same contour (C), the plane of the primary track corresponding to the main conductive layer of the circuit, said layer being deposited on a substrate (30), and the secondary track being supported, plumb with the primary track, by supporting means including walls (41-46; 51-56), each wall bearing directly on the substrate and against a lower surface (24) of the secondary track (20), and having (Continued)

a length (L) larger than a width (I), and having a height allowing a predetermined interval to be created between an upper surface (14) of the primary track (10) and the lower surface (24) of the secondary track (20).

9 Claims, 3 Drawing Sheets

(51) Int. Cl.
    *H01L 23/522*      (2006.01)
    *H01F 27/28*      (2006.01)
    *H01P 5/18*      (2006.01)
    *H01P 5/12*      (2006.01)
    *H01L 23/66*      (2006.01)

(52) U.S. Cl.
    CPC ......... *H01F 27/2804* (2013.01); *H01L 23/66* (2013.01); *H01P 5/12* (2013.01); *H01P 5/181* (2013.01); *H01F 2027/2809* (2013.01); *H01L 2223/6672* (2013.01)

(56) References Cited

U.S. PATENT DOCUMENTS

| | | | |
|---|---|---|---|
| 6,504,109 B1 * | 1/2003 | Aval | H01P 3/08 174/255 |
| 6,518,165 B1 * | 2/2003 | Yoon | H01L 23/522 257/E23.142 |
| 7,808,343 B1 * | 10/2010 | Iannotti | H01P 5/187 333/117 |
| 2001/0035809 A1 * | 11/2001 | Goff | H01F 17/0006 336/200 |
| 2002/0030250 A1 * | 3/2002 | Ammar | H01L 23/043 257/664 |
| 2002/0093075 A1 * | 7/2002 | Gates | H01F 17/0006 257/531 |
| 2004/0227608 A1 * | 11/2004 | Nakatani | H01P 5/10 336/173 |
| 2005/0073025 A1 * | 4/2005 | Hashizume | H01F 17/0006 257/531 |
| 2007/0052491 A1 * | 3/2007 | Kintis | H01P 5/10 333/25 |
| 2009/0102316 A1 * | 4/2009 | Belot | H03H 9/02228 310/311 |
| 2010/0301987 A1 * | 12/2010 | Belot | H01F 19/04 336/222 |
| 2013/0147580 A1 * | 6/2013 | Nagai | H01P 7/084 333/204 |
| 2014/0203888 A1 * | 7/2014 | Nagai | H01P 5/028 333/117 |

* cited by examiner

TRANSFORMER FOR A CIRCUIT IN MMIC TECHNOLOGY

CROSS-REFERENCE TO RELATED APPLICATIONS

This application is based upon and claims the benefit of priority of the prior French Patent Application No. FR 15 01335, filed on Jun. 25, 2015, the entire contents of which are incorporated herein by reference.

FIELD OF THE INVENTION

The present invention relates to a transformer for a circuit in MMIC technology, of the type including a primary track and a secondary track that are coupled to one another by mutual inductance, the primary and secondary tracks being superimposed on top of each other in two different parallel planes, while being arranged so as to follow a same contour, the plane of the primary track corresponding to the main conductive layer of the circuit, deposited on a substrate, and the secondary track being supported, plumb with the primary track, by supporting means.

BACKGROUND

The MMIC (Monolithic Microwave Integrated Circuit) technology, for example GaN or AsGa, provides for etching a main conductive metal layer deposited on a substrate.

The two main issues in the integration in MMIC technology of transformers based on inductances of the impedance and/or balun (balanced-to-unbalanced transformer) type are those of the effectiveness of the transformer and its steric bulk. Indeed, a transformer with minimal losses should be produced to increase the overall efficiency of the system in which it is installed, but also to reduce its size to increase the compactness of the system.

In addition to the "symmetrical-to-dissymmetric transformer" function, such a component may also serve as an impedance transformer, in particular usable for impedance adaptation during the combination of power amplifiers.

Traditionally, in MMIC technology, the circuit has only a single metallized layer available to implement patterns. The transformers are made in a planar manner by arranging the two windings of one next to the other or by interleaving them in one another. This solution has the drawback of increasing losses, since planar coupling does not lend itself well to energy transfers. It is also very bulky.

It is known, in particular to allow the intersection of tracks such that it does not come into contact, to produce air bridges. An air bridge is made up of two pillars made from a conductive material bearing on each of the ends to be electrically connected of a track interrupted to cross another track. The pillars support a bridge, also made from a conductive material. The bridge is located in a plane parallel to the main plane of the circuit. The dielectric between the bridge and the main metal layer is simply the air from the surrounding environment.

Document US 2001/0035809 uses this principle of air bridges to produce a transformer of the aforementioned type, in which the supporting means of the secondary track are made up of pillars and the secondary track is made up of a series of bridges in electrical continuity with one another.

Such a vertical transformer is particularly interesting in terms of integration and ease of production.

However, in this approach, the secondary winding produced using air bridges is supported by multiple pillars. The primary winding, which is made on the main metal layer, has meanders to go around all of the pillars.

This reduces the facing surface area with the secondary winding, which decreases the coupling accordingly, and therefore the transfer of energy between the primary and the secondary of the transformer.

This also requires many angles and a relatively small working section. This is not favorable to the transfer of energy, since the power level able to traverse the primary winding is limited.

Furthermore, the air bridges are supported by the pillars in small localized bearing zones. This can cause mechanical stability problems of the secondary winding, or even the collapse of the latter when the transformer is subject to substantial vibrations. It is then necessary to reduce the span of the bridges, i.e., the distance between two successive support pillars. However, this requires increasing the number of pillars, and consequently further reducing the width of the primary winding so as to be able to bypass these pillars easily.

It should be noted that vertical transformers exist in Silicon technology, since the latter has several metallized layers. The problem of creating a second conductive plane therefore does not arise.

SUMMARY

The invention therefore aims to offset the aforementioned drawbacks, in particular by proposing an improved transformer.

The invention relates to a transformer of the aforementioned type, characterized in that the supporting means include at least one wall, the wall bearing directly on the substrate of the circuit and on a lower surface of the secondary track, a length of the wall being greater than a width of the wall, and the wall having a height making it possible to arrange a predetermined interval between an upper surface of the primary track and the lower surface of the secondary track.

According to specific embodiments, the transformer includes one or more of the following features, considered alone or according to any technically possible combinations:
  the primary track includes a window having a length and width respectively larger than the length and the width of the wall, the wall traversing the window to bear directly on the substrate.
  the wall is configured to follow the average section of the secondary track and the window follows the average section of the primary track.
  the supporting means include a pair of walls, the walls of a pair of walls facing one another along the direction transverse to said contour and bearing on the substrate on either side of the primary track.
  each wall of a pair of walls is in contact with the lower surface of the secondary track, near the lateral edge of the secondary track, a width of the secondary track being greater than a width of the primary track.
  the supporting means include a reinforced wall able to support a section of the secondary track below which there is no corresponding section of the primary track, the width of a reinforced wall being substantially equal to the width of the secondary track.
  the width of the secondary track is substantially equal to the width of the primary track so as to maximize a facing surface of the tracks with respect to one another.
  the lateral edges of the primary track and/or the lateral edges of the secondary track are rectilinear, a section along a direction transverse to the contour of the primary track and/or the secondary track being substantially constant at all points of the contour.

one track from among the primary track and the secondary track includes a plurality of windings.

the contour includes at least one loop, circular or polygonal, optionally including meanders.

BRIEF DESCRIPTION OF THE DRAWINGS

The invention will be better understood and other features, aims and advantages thereof will appear more clearly in light of the following description of two particular embodiments of the invention, provided solely as an exemplary and non-limiting example, this description being done in reference to the appended drawings, in which.

DETAILED DESCRIPTION

First Embodiment

Figure 1:
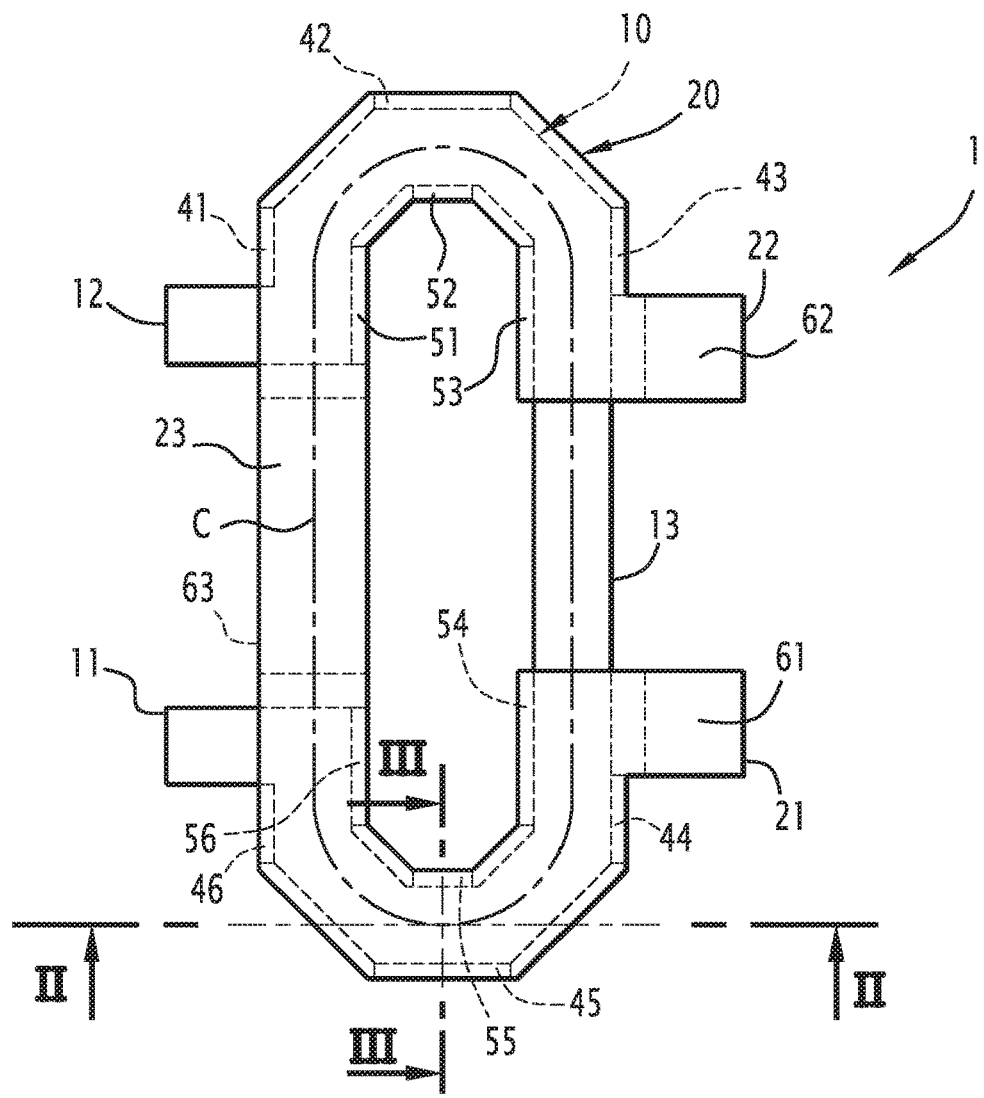
FIG. 1 schematically shows a top view of a first embodiment of the transformer according to the invention.
Figure 2:
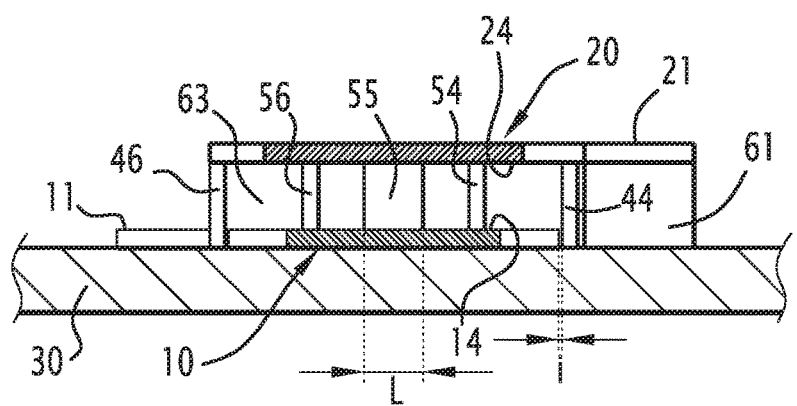
FIGS. 2 and 3 show a cross-section and a sectional view of the transformer of FIG. 1, respectively along longitudinal line II-II and transverse line III-III of FIG. 1.
Figure 3:
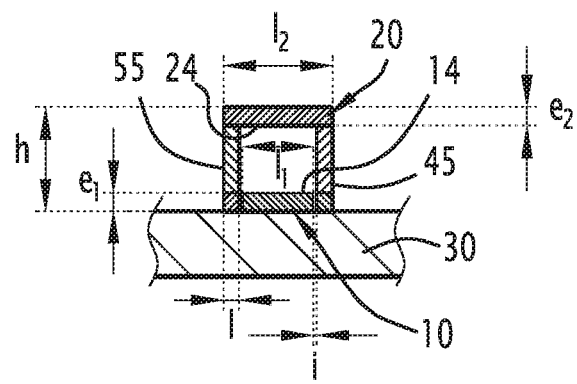

FIGS. 1 to 3 illustrate a transformer according to a first embodiment.

The transformer 1 is intended to be integrated into a circuit in MMIC technology.

It includes a primary track 10 and a secondary track 20. During operation, the tracks 10 and 20 are coupled to one another by inductive coupling.

The primary track 10 is made in the main metal layer of the MMIC circuit.

The primary track 10 extends between two end sections 11 and 12 intended to be connected to connection terminals of the primary of the transformer 1.

The primary track 10 is arranged such that an average section of the track 10 follows the contour C, in the shape of an octagon fitted into an ovoid.

Hereinafter, the main direction corresponds to the direction of the tangent to the contour C at the considered point, and the transverse direction corresponds to the direction perpendicular to the main direction at that point.

Transversely to the contour C, the primary track 10 has a rectangular section with thickness e1 and width 11. These dimensions are substantially constant along the contour C.

The secondary track 20 is located above the primary track 10, in a plane parallel to that of the main layer. It is supported by supporting means.

The track 20 extends between two end sections 21 and 22 intended to be connected to connection terminals of the secondary transformer 1.

The secondary track 20 is arranged such that an average section of the track 20 follows the contour C.

The ends of the secondary track 20 are diametrically opposite those of the primary track. Consequently, an intermediate section 13 of the primary track 10, located between the end sections 21 and 22 of the secondary track 20, is not covered by the secondary track 20. Reciprocally, an intermediate section 23 of the secondary track 20, located between the end sections 11 and 12 of the primary track 10, does not cover the primary track 10.

Transversely to the contour C, the track 20 has a rectangular section with thickness e2 and width 12. These dimensions are substantially constant along the contour C.

The width 12 of the secondary track 20 is slightly larger than the width 11 of the primary track 10, such that the secondary track 20 extends transversely past the lateral edges of the primary track 10.

The secondary track 20 is made from a metal material, that traditionally used to produce air bridges in MMIC technology.

The transformer 1 includes, as supporting means for the secondary track, a plurality of walls, each wall bearing directly on the substrate 30 of the circuit.

A wall has a length L, along a main direction tangential to the contour C, that is larger than a width I, along a direction transverse to the main direction.

The walls have a shared height h making it possible to arrange a predetermined interval between an upper surface 14 of the primary track and a lower surface 24 of the secondary track.

For reasons related to the manufacturing method, the lower part of a wall is made from the metal of the main layer of the circuit. The upper part of a wall is made up of the material traditionally used to produce pillars for air bridges. Between the lower part and the upper part, a wall includes an insulating layer, for example made from an appropriate oxide, so as not to produce a direct electrical connection between the two tracks 10 and 20, the transformer function having to be performed only by electromagnetic coupling between the primary track 10 and the assembly formed by the secondary track and the upper parts of the walls.

In the first embodiment, the walls are in pairs. The secondary track 20 is thus supported by the pairs 41, 51; 42, 52; 43, 53; 44, 54; 45, 55 and 46, 56.

The walls of a pair of walls are arranged on either side of the primary track 10. A predetermined interval i is arranged between the face of a wall and the facing lateral edge of the primary track 10, so as to prevent any electrical contact.

Since the walls support the secondary track 20 from below, the secondary track 20 must be wider than the primary track 10.

The primary track 10 is thus confined inside a tunnel forming the secondary of the transformer. Advantageously, the walls located on a same side of the primary track 10 are brought closer to one another, optionally so as to form a continuous partition along all or part of the corresponding lateral edge of the primary track 10.

The electromagnetic coupling between the primary and the secondary is determined by the total facing surface of the two tracks. The larger this facing surface is, the greater the electromagnetic coupling is.

The upper part of the walls being part of the secondary of the transformer, it makes it possible to limit the leaks of the magnetic field generated by the circulation of a current in the primary track 10, and consequently to increase the effectiveness of the transformer, for example relative to that of document US 2001/0035809.

The supporting means also include reinforced walls 61, 62 and 63 able to support a section of the secondary track 20 below which there is no corresponding section of the primary track 10. It is end sections 21 and 22 and the intermediate section 23 of the secondary track 20 that are respectively supported by the reinforced walls 61, 62 and 63.

A reinforced wall is a wall whose width is substantially equal to that of the secondary track 20. Advantageously, a reinforced wall extends over the essential part of the section of the secondary track 20 below which there is no section of the primary track 10, while retaining, in the main plane of the circuit, an interval with the primary track 10 making it possible to avoid any electrical contact between the reinforced wall and the primary track.

With such reinforced walls, the mechanical strength of the transformer 1, already improved by the presence of the walls 41 to 56, is further increased. The transformer thus obtained is particularly strong.

One skilled in the art will note that the lateral edges of the primary track 10 and/or the lateral edges of the secondary track 20 are rectilinear and that the section along a direction transverse to the contour C of the primary track 10 and/or of the secondary track 20 is substantially constant at all points of the contour C, contrary to document US 2001/0035809, where the primary track, at least, includes lateral indentations to go around the pillars and consequently has a section whose dimensions vary along the contour followed. Yet such a variation of the section deteriorates the properties of the transformer, in particular the power that it is able to cause to pass through the primary and/or the secondary of the transformer.

Alternatively, the contour C may assume other forms. It may in particular include meanders so as to reduce its lateral bulk. It may also include several loops.

In still another alternative, independent of the previous ones, a track may be subdivided so as to be made up of several windings.

With the geometry just described above, the facing surface between the tracks of the primary and the secondary is maximized, resulting in improved efficiency of the transformer.

Second Embodiment

In this second embodiment, the elements similar elements of the first embodiment are referenced by the reference figure used to reference this similar element in the first embodiment, increased by one hundred.

Figure 4:
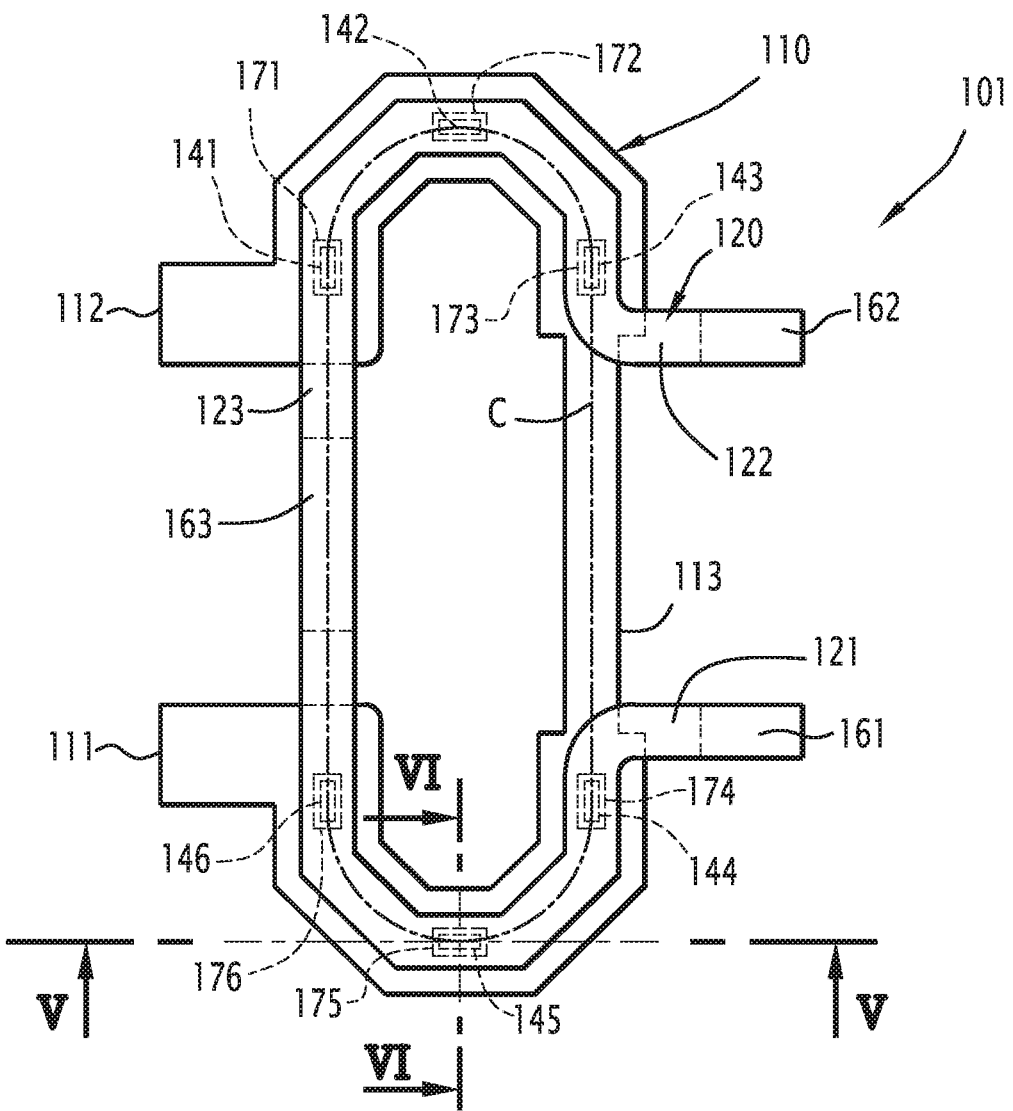
FIG. 4 schematically shows a top view of a second embodiment of the transformer according to the invention.
Figure 5:
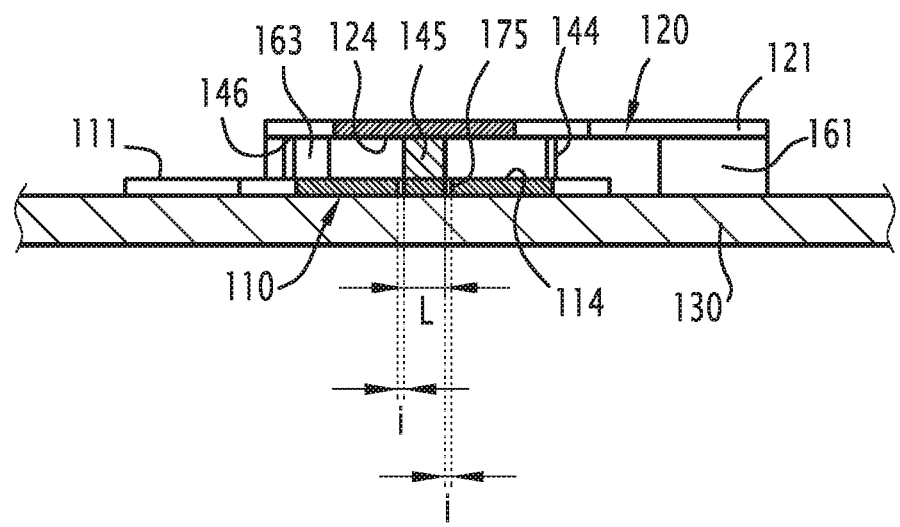
FIGS. 5 and 6 show a cross-section and a sectional view of the transformer of FIG. 4, respectively along longitudinal line V-V and transverse line VI-VI of FIG. 4.
Figure 6:
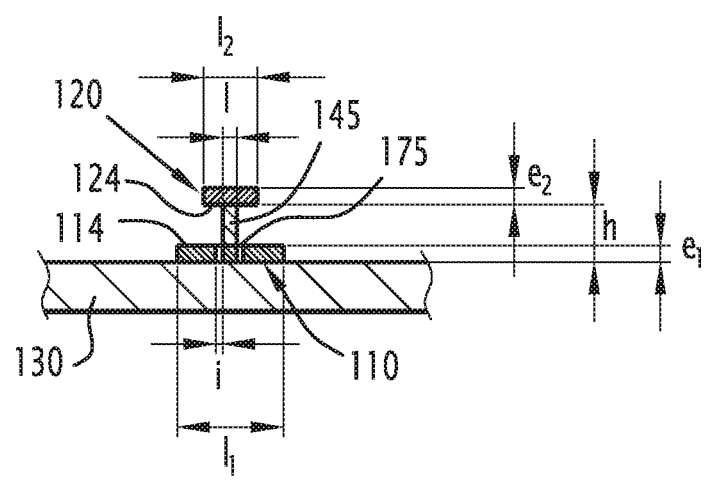

FIGS. 4 to 6 illustrate a transformer according to a second embodiment.

The transformer 101 is intended to be integrated into a circuit in MMIC technology.

It includes a primary track 110 and a secondary track 120. Mutual inductance During operation, the tracks 110 and 120 are coupled to one another by inductive coupling.

The primary track 110 is made in the main metal layer of the MMIC circuit.

The primary track 110 extends between two end sections 111 and 112 intended to be connected to connection terminals of the primary transformer 101.

The primary track 110 is arranged such that an average section of the track 110 follows the contour C, in the shape of an octagon fitted into an ovoid.

Transversely to the contour C, the primary track 110 has a rectangular section with thickness el and with 11. These dimensions are substantially constant along the contour C.

The secondary track 120 is located above the primary track 110, in a plane parallel to that of the main layer. It is supported by supporting means.

The primary track 120 extends between two end sections 121 and 122 intended to be connected to connection terminals of the secondary of the transformer 101.

The secondary track 120 is arranged such that an average section of the track 120 follows the contour C.

The ends of the secondary track 120 are diametrically opposite those of the primary track 110. Consequently, an intermediate section 113 of the primary track 110, located between the end sections 121 and 122 of the secondary track 120, is not covered by the secondary track 120. Reciprocally, an intermediate section 123 of the secondary track 120, located between the end sections 111 and 112 of the primary track 110, does not cover the primary track 110.

Transversely to the contour C, the track 120 has a rectangular section with thickness e2 and with 12. These dimensions are substantially constant along the contour C.

The width 12 of the secondary track 120 here is slightly smaller than the width 11 of the primary track 110, such that the primary track 110 extends transversely past the lateral edges of the secondary track 120.

The secondary track 120 is made from a metal material, that traditionally used to produce air bridges in MMIC technology.

The transformer 101 includes, as supporting means for the secondary track, a plurality of walls 141 to 146, each wall bearing directly on the substrate 130.

A wall has a length L, along a main direction tangential to the contour C, that is larger than a width I, along a direction transverse to the main direction.

The walls have a shared height h making it possible to arrange a predetermined interval between an upper surface 114 of the primary track 110 and a lower surface 124 of the secondary track 120.

For reasons related to the manufacturing method, the lower part of a wall is made from the metal of the main layer of the circuit. The upper part of a wall is made up of the material traditionally used to produce pillars for air bridges. Between the lower part and the upper part, a wall includes an insulating layer, for example made from an appropriate oxide, so as not to produce a direct electrical connection between the two tracks 110 and 120, the transformer function having to be performed only by electromagnetic coupling between the primary track 110 and the assembly formed by the secondary track 120 and the upper parts of the walls.

In this second embodiment, the walls are central walls rising from the substrate 130 and supporting the secondary track 120 near its average section. The secondary track 120 is thus supported by the walls 141, 142, 143, 144, 145, 146.

To avoid contact between a wall and the primary layer 110, the latter is provided with a cutout forming a window 171 to 176. The track 110 is subdivided into two lateral portions on either side of the window.

The longitudinal and transverse dimensions of this window are respectively larger than the length and the width I of the wall that traverses it, so as to arrange an interval i on either side of the wall, both in the main direction and in the transverse direction. Thus, the interval i arranged between the face of a wall and the facing lateral edge of the primary track 10 makes it possible to prevent any electrical contact.

In this second embodiment, since the walls support the secondary track 20 from below, but substantially along its average section, the width of the secondary track 20 is not restricted by that of the primary track 10. It may for example be narrower, as shown in FIGS. 4 to 6 However, it could also be equal to or larger than the width of the primary track.

The walls are brought closer to one another, optionally so as to form a continuous partition along all or part of the average section of the primary track 10.

The electromagnetic coupling between the primary and the secondary is determined by the total facing surface of the two tracks. The larger this facing surface is, the greater the electromagnetic coupling is.

The upper part of the walls being part of the secondary of the transformer, it makes it possible to limit the leaks of the magnetic field generated by the circulation of a current in the primary track 10, and consequently to increase the effectiveness of the transformer, relative to that of document US 2001/0035809. However, this second embodiment is less effective than the first, the walls being placed at the center of the primary track 10 and not on its lateral edges, where the leaks are maximal.

Alternatively, whereas in the second embodiment, the wall is arranged to follow the average section of the secondary track 120 and the window to follow the average section of the primary track, other arrangements can be considered, in particular an arrangement in which a wall is installed such that its length is in the direction transverse to the contour C at the installation point of this wall.

The supporting means also include reinforced walls 161, 162 and 163 able to support a section of the secondary track 120 below which there is no corresponding section of the primary track 110. It is end sections 121 and 122 and the intermediate section 123 of the secondary track 120 that are respectively supported by the reinforced walls 161, 162 and 163.

A reinforced wall is a wall whose width is substantially equal to that of the secondary track 120. Advantageously, a reinforced wall extends over the essential part of the section of the secondary track 120 below which there is no section of the primary track 110, while retaining, in the main plane of the circuit, an interval with the primary track 110 making it possible to avoid any electrical contact between the reinforced wall and the primary track.

With such reinforced walls, the mechanical strength of the transformer 101, already improved by the presence of the walls 141 to 146, is further increased. The transformer thus obtained is particularly strong.

The invention claimed is:

1. A transformer for a circuit in MMIC technology, of the type including a primary track and a secondary track that are coupled to one another by mutual inductance, the primary and secondary tracks being superimposed on top of each other in two different parallel planes, while being arranged so as to follow a same contour, the plane of the primary track corresponding to the main conductive layer of the circuit, deposited on a substrate, and the secondary track being supported, plumb with the primary track, by supporting means, wherein the supporting means comprises at least one wall, the wall bearing directly on the substrate of the circuit and on a lower surface of the secondary track, a length of the wall being greater than a width of the wall, the wall having a shared height making it possible to arrange a predetermined interval between an upper surface of the primary track and the lower surface of the secondary track, and the wall comprising a lower part made from a first metal of the main conductive layer of the circuit, an upper part made from a second metal of the secondary track, and, between the lower part and the upper part, an insulating layer, the transformer function being performed by electromagnetic coupling between the primary track and the assembly formed by the secondary track and the upper part of the wall.

2. The transformer according to claim 1, wherein the primary track includes a window having a length and a width respectively larger than the length and the width of the wall, the wall traversing the window to bear directly on the substrate.

3. The transformer according to claim 2, wherein the wall is configured to follow the average section of the secondary track and the window follows the average section of the primary track.

4. The transformer according to claim 1, wherein the supporting means includes a pair of walls, the walls of a pair of walls facing one another along the direction transverse to said contour and bearing on the substrate on either side of the primary track.

5. The transformer according to claim 4, wherein each wall of a pair of walls is in contact with the lower surface of the secondary track, near the lateral edge of the secondary track, a width of the secondary track being greater than a width of the primary track.

6. The transformer according to claim 1, wherein the supporting means include a reinforced wall able to support a section of the secondary track below which there is no corresponding section of the primary track, the width of a reinforced wall being substantially equal to the width of the secondary track.

7. The transformer according to claim 1, wherein the width of the secondary track is substantially equal to the width of the primary track so as to maximize a facing surface of the tracks with respect to one another.

8. The transformer according to claim 1, wherein the lateral edges of the primary track and/or the lateral edges of the secondary track are rectilinear, a section along a direction transverse to the contour of the primary track and/or the secondary track being substantially constant at all points of the contour.

9. The transformer according to claim 1, wherein the contour includes at least one loop, circular or polygonal.

* * * * *